(12) United States Patent
Watanabe et al.

(10) Patent No.: US 7,932,150 B2
(45) Date of Patent: Apr. 26, 2011

(54) LATERAL OXIDATION WITH HIGH-K DIELECTRIC LINER

(75) Inventors: Takeshi Watanabe, Saratoga Springs, NY (US); Ryosuke Iijima, Chappaqua, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 12/124,794

(22) Filed: May 21, 2008

(65) Prior Publication Data

US 2009/0289306 A1    Nov. 26, 2009

(51) Int. Cl.
*H01L 21/336* (2006.01)
(52) U.S. Cl. .................................. 438/265; 438/197
(58) Field of Classification Search .............. 438/197, 438/265
See application file for complete search history.

(56) References Cited

U.S. PATENT DOCUMENTS

| | | | |
|---|---|---|---|
| 5,904,517 A * | 5/1999 | Gardner et al. ............ | 438/197 |
| 7,220,635 B2 | 5/2007 | Brask et al. | |
| 7,323,423 B2 | 1/2008 | Brask et al. | |
| 2006/0246740 A1* | 11/2006 | Cartier et al. ............ | 438/778 |
| 2007/0007571 A1* | 1/2007 | Lindsay et al. ............ | 257/306 |
| 2007/0141798 A1 | 6/2007 | Bohr | |

OTHER PUBLICATIONS

McFeeley, et al., Role of Oxygen Vacancies in VFB/Vt Stability of pFET metals on HfO2, Symposium on VLSI Technology Digest of Technical Papers, 2005.
Tsuchiya, et al., Work Function Instability at pMOS Metal/HfSiON Interfaces, Extended Abstracts of the 2006 International Conference on Solid State Devices and Materials, Yokohama, 2006 pp. 1132-1133.
Shiraishi, et al., Physics in Fermi Level Pinning at the PolySi/Hf-based High-k Oxide Interface, Symposium on VLSI Technology, 2004.
Cartier, et al.; Role of Oxygen Vacancies in VFB/Vt stability of pFET metals on HfO2, 2005 Symposium on VLSI Technology Digest of Technical Papers, pp. 230-231.

* cited by examiner

*Primary Examiner* — Matthew S Smith
*Assistant Examiner* — John M Parker
(74) *Attorney, Agent, or Firm* — Turocy & Watson, LLP

(57) ABSTRACT

Disclosed are methods of making and using a high-K dielectric liner to facilitate the lateral oxidation of a high-K gate dielectric, integrated circuit structures containing the high-K dielectric liner and/or oxidized high-K gate dielectric, and other associated methods.

18 Claims, 18 Drawing Sheets

LATERAL OXIDATION WITH HIGH-K DIELECTRIC LINER

TECHNICAL FIELD

Described are methods of making and using a high-K dielectric liner to facilitate the lateral oxidation of a high-K gate dielectric, integrated circuit structures containing the high-K dielectric liner and/or oxidized high-K gate dielectric, and other associated methods.

BACKGROUND

The continuous trend in the semiconductor industry involves achieving higher and higher circuit density with increasing numbers of transistors, lower operating voltages, and higher access speeds. The trend is fueled by efforts in scaling down device dimensions (e.g., at sub-micron levels).

Transistors undergo scaling, in part, by shrinking the transistor gate dielectric. For example, silicon dioxide gate insulating films with a thickness of 2 nm are available. While the relatively thin gate insulating films increase operation speeds, other problems are undesirably created.

But generally as transistors shrink, leakage current increases. Leakage inhibits the performance of a microelectronic device. Power consumption is an important concern due to gate leakage. In electronic devices, it is typically desirable to reduce the amount of power that is consumed by a microelectronic device. This is because in battery powered electronic devices it is typically desirable to reduce the amount of power consumed by the microelectronic device in order to extend the time the electrical device may be powered by a battery. Managing gate leakage current is an important concern in making reliable high-speed operation transistors. Thus, within the context of scaling, managing gate leakage current is an increasingly important factor in the semiconductor industry.

Metal oxide semiconductor field-effect transistors (MOSFETs) with thin gate dielectrics made from silicon dioxide often experience unacceptable gate leakage currents. Forming the gate dielectric from certain high-K dielectric materials instead of silicon dioxide can reduce gate leakage. However, high-K dielectric materials may not be compatible with polysilicon. When relatively thin high-K dielectric layers contain an oxide, the layers may undesirably have oxygen vacancies and excess impurity levels. Oxygen vacancies raise concerns because they permit undesirable interaction between the high-K dielectric layer and the gate electrode. And when the gate electrode contains polysilicon, such interaction may alter the work function of the gate electrode or cause the device to short through the dielectric. In such instances, it is desirable to use metal gate electrodes in microelectronic devices that contain high-K gate dielectric layers since metal gate electrodes are typically more compatible with high-K gate dielectrics than polysilicon.

Metal gate electrodes have several desirable features compared to polysilicon including, fewer poly depletion effects if not the complete elimination of poly depletion effects and consequent improvement in gate control over the channel. However, metal gate electrodes have a constant or uniform work function across the microelectronic device. In other words, the work function of the gate electrode is constant from one source/drain region across the channel region to the other source/drain region.

When a high-K dielectric layer is initially formed, it may have a slightly imperfect molecular structure. To repair the high-K dielectric layer, it may be necessary to anneal at a relatively high temperature. However, the materials used in the metal gate electrode typically cannot tolerate the high temperatures associated with annealing the high-k dielectric layer. As a result, process flows are employed such that the high-k gate dielectric layer may be annealed without damaging the metal gate electrode. In particular, a so-called gate last process is often employed to make metal gate/high-K gate dielectric structures. The gate last process refers to the order of forming the metal gate relative to the polysilicon deposition act. The gate last process is sometimes known as the replacement gate process.

A problem with the gate last process is the enormous cost compared to a gate first process. In CMOS technology, while the gate first process is much less expensive than a gate last process, the gate first process undesirably induces large Vth of the pFET. This is because the high temperature of the annealing act creates oxygen vacancies (positive charges) in the high-K gate dielectric. The large Vth can be mitigated by oxidizing the structure in an oxygen containing atmosphere as oxidation reduces Vth of pFET.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

One aspect of the invention relates to a method of oxidizing a high-K gate dielectric of a FET in an integrated circuit structure involving forming a high-K dielectric liner over the FET, the FET containing a metal gate and the high-K gate dielectric, the high-K dielectric liner in contact with the high-K gate dielectric to allow oxygen from the high-K dielectric liner to oxidize the high-K gate dielectric.

Another aspect of the invention relates to method of reducing Vth of a pFET that contains a metal gate and a high-K gate dielectric involving forming a high-K dielectric liner over the pFET so that the high-K dielectric liner is in direct contact with the high-K gate dielectric to allow oxygen from the high-K dielectric liner to oxidize the high-K gate dielectric.

Yet another aspect of the invention relates to CMOS integrated circuit that contains nFETs in an p-type portion of a substrate and pFETs containing a metal gate and a high-K gate dielectric in a n-type portion of the substrate, a high-K dielectric liner covering at least one of the pFETs and in direct contact with the high-K gate dielectric.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Using a high-K dielectric liner to facilitate controlled lateral oxidation of high-K gate dielectrics is described herein. Providing a high-K dielectric liner in contact with a high-K gate dielectric for a specified period of time enables one to tailor the extent of lateral oxidation in a high-K gate dielectric in accordance with the resultant microelectronic device characteristics, such as that desirable for a specific type of microelectronic device or transistor. Use of the high-K dielectric liner to achieve lateral oxidation of high-K gate dielectrics can be employed in a gate first process, often used to make CMOS logic devices. The high-K dielectric liner is formed over a FET containing a high-K gate dielectric (and typically a metal gate).

Figure 17:
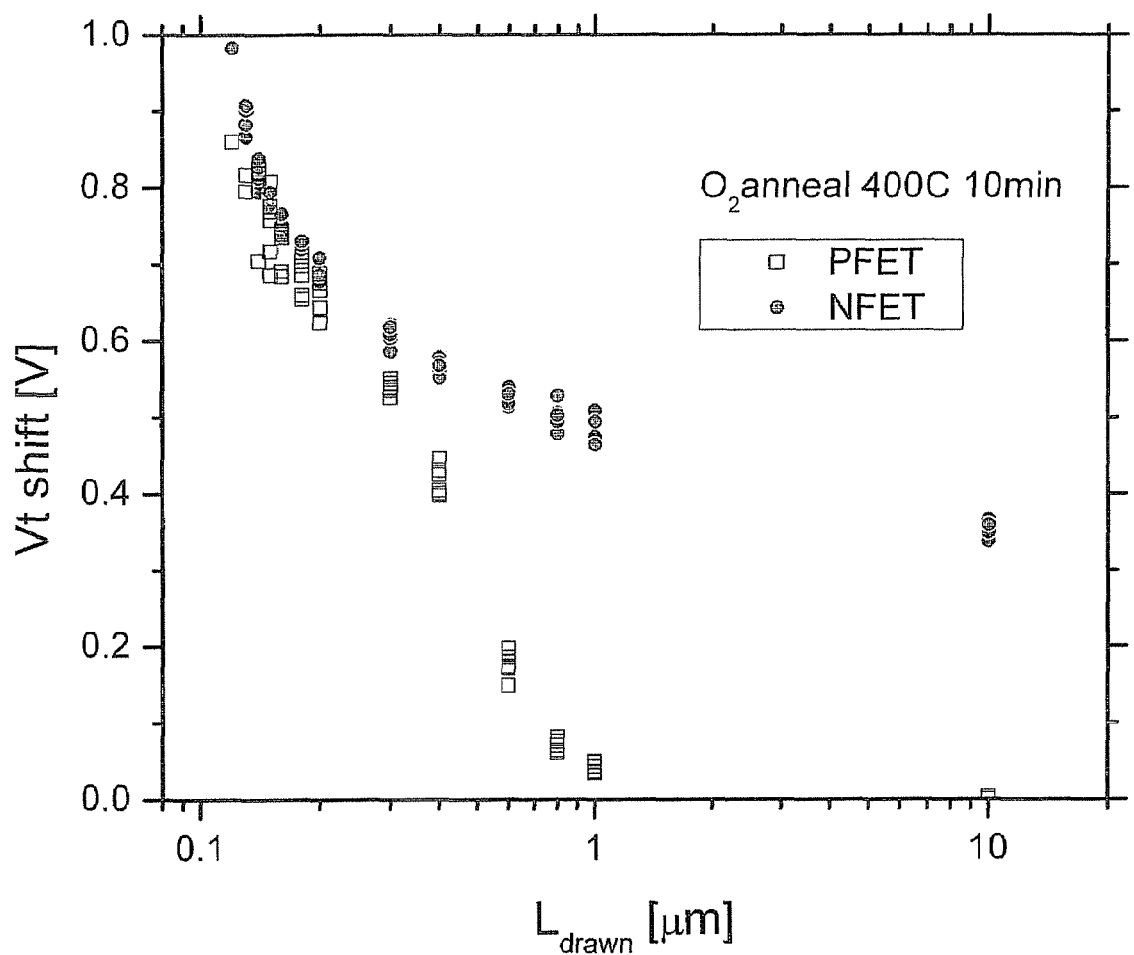
FIG. 17 is a graph illustrating the dependence of Vth shift on gate length (L) after oxidation for a high-K gate dielectric.

There are two concerns raised by oxidizing a high-K gate dielectric layer in a gate first process. First, the Vth shift depends on gate length. FIG. 17 is a graph illustrating the dependence of Vth shift on gate length (L) after oxidation in an oxygen atmosphere for 10 minutes at 400° C. The longer the gate length, the greater amount of oxygen required. This is because oxygen is introduced into the high-k gate dielectric layer at the gate edge. In many instances, the Vth shift is too small for relatively long gate lengths. Simply increasing the amount of oxygen does not resolve the concern because strong oxidation induces re-growth of silicon dioxide and interfacial states, especially near the edges of the high-k gate dielectric layer.

Figure 18:
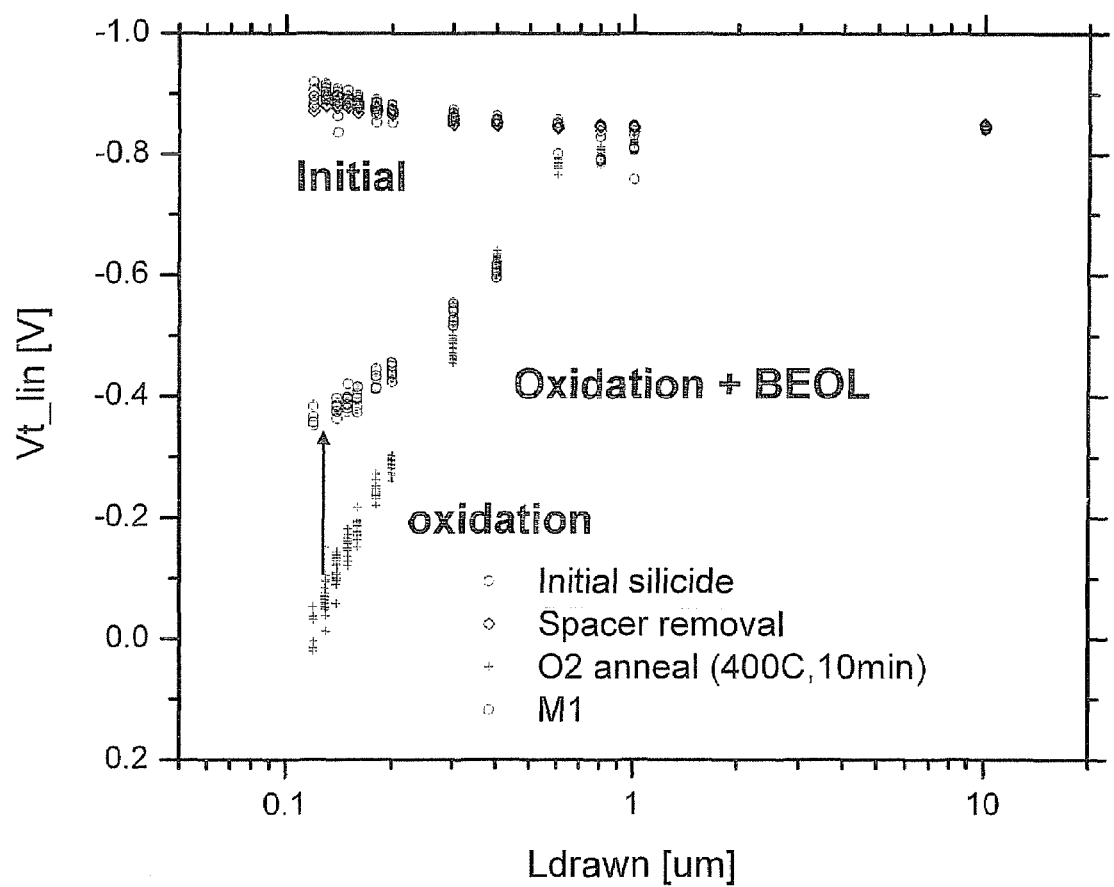
FIG. 18 is a graph illustrating the undesired effect of increasing the Vth as a result of heating/oxidation in back end of the line processing for a high-K gate dielectric.

Second, Vth is undesirably increased by subsequent anneal acts in later processing (in back end of the line processing (BEOL)). Efforts in mitigating the undesirably large Vth shift of the pFET can be rendered meaningless when a heat treatment act re-increases the Vth of pFET. FIG. 18 is a graph illustrating the undesired effect of increasing the Vth as a result of heating/oxidation in back end of the line processing.

The high-K dielectric liner as described herein mitigates the two aforementioned concerns. Specifically, the high-K dielectric liner permits a controlled amount of oxygen ingress to the center of a high-K gate dielectric layer without causing (or minimizing) growth of silicon dioxide and interfacial states near the edges of the high-k gate dielectric layer. The presence of the high-K dielectric liner also permits a controlled amount of oxygen ingress to the high-K gate dielectric layer during annealing acts in BEOL processing.

Figure 1:
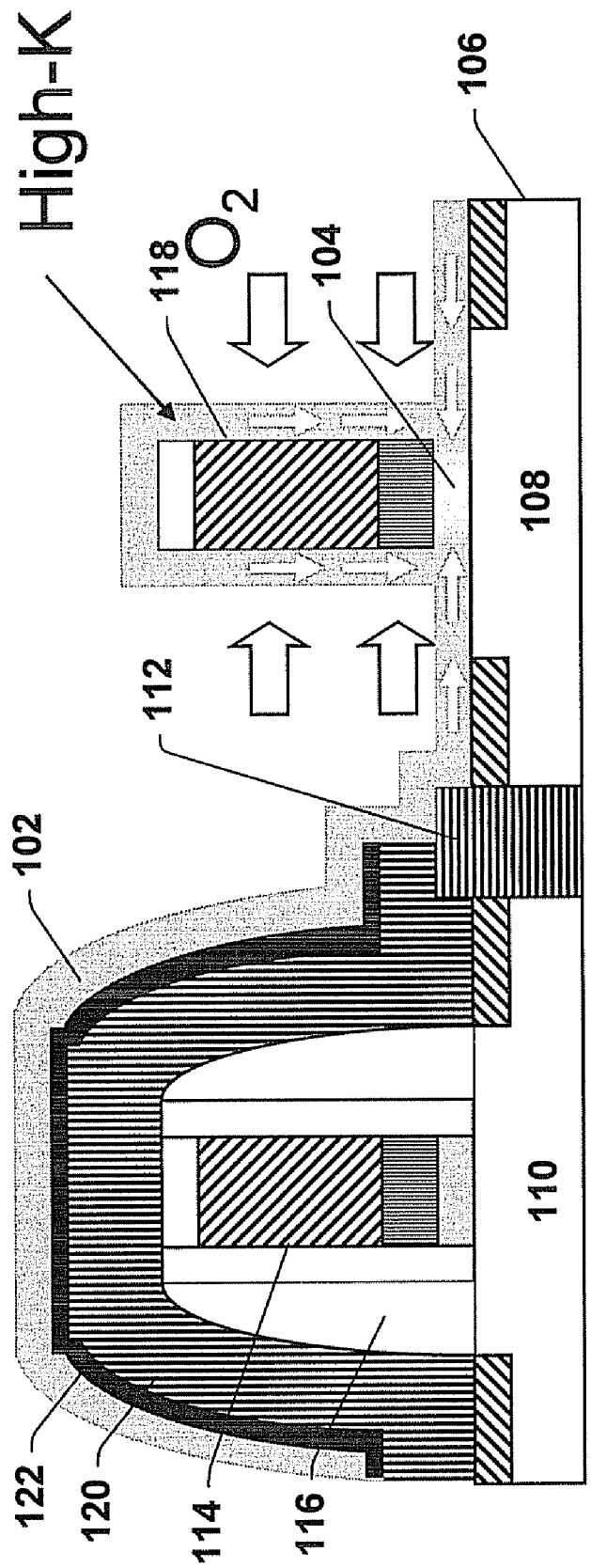
FIG. 1 is a high-level cross-sectional view of a structure involved in making and using high-K dielectric liners in accordance with an aspect of the invention.

Referring to FIG. 1, a high level illustration of a high-K dielectric liner 102 in a CMOS structure 100 is shown. The CMOS structure 100 contains a substrate 106 with a n-type region 108 and an p-type region 110, and optionally isolation structures 112 therein. An nFET 114 is formed in the nFET region while a pFET 118 is formed in the pFET region, the nFETs in the nFET region having spacers 116 and a tensile stress liner 120 unremoved. A protection layer 122 is formed over the nFET 114 in the nFET region to facilitate processing of pFET 118 on the unprotected pFET region.

The high-K dielectric liner 102 is formed directly over the pFET only. A high-K material with oxygen transportability is employed to facilitate the introduction of oxygen into the high-K gate dielectric 104. The solid black arrows show the movement of oxygen within the high-K dielectric liner 102, and specifically the movement of oxygen in the high-K dielectric liner 102 to the high-K gate dielectric 104. The hollow arrows show the movement of oxygen from the surrounding atmosphere into the high-K dielectric liner 102 (the high-K dielectric liner 102 functioning as an oxygen getter from the ambient).

The high-K dielectric liner 102 permits a controlled amount of oxygen into the high-K gate dielectric layer 104. The amount of oxygen contained in the high-K dielectric liner 102, and thus the amount of oxygen that can migrate into the high-K gate dielectric layer 104 is dependent on a number of factors including: the amount of oxygen in the atmosphere surrounding the CMOS structure, the temperature of the atmosphere surrounding the CMOS structure, the thickness of the high-K dielectric liner, the length of time that the high-K dielectric liner is exposed to an oxygen atmosphere, the length of time that the high-K dielectric liner remains on the pFET, the identity of the high-K material in the high-K dielectric liner, and the like.

Figure 2:
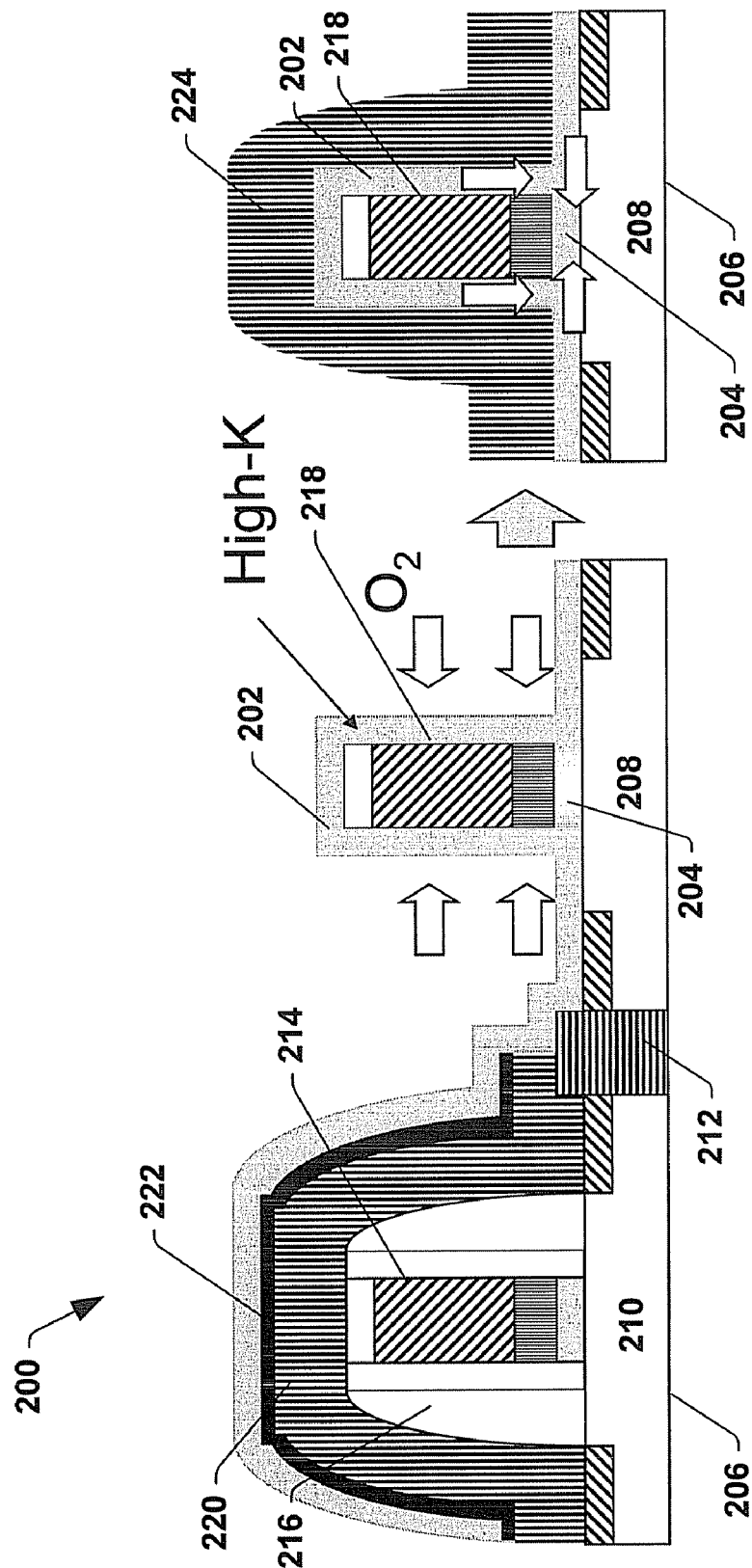
FIG. 2 is a high-level cross-sectional view of a structure involved in making and using high-K dielectric liners in accordance with another aspect of the invention.

The high-K dielectric liner that is formed over the pFET only can be removed and standard CMOS processing resumed, or the high-K dielectric liner that is formed over the pFET can be retained for further CMOS processing. In this connection, referring to FIG. 2, a high level illustration of retaining a high-K dielectric liner 202 on a pFET 218 for further processing is shown. The CMOS structure 200 contains a substrate 206 with a pFET region 208 and an nFET region 210, and optionally isolation structures 212 therein. An nFET 214 is formed in the nFET region while a pFET 218 is formed in the pFET region, the nFETs in the nFET region having spacers 216 and a tensile stress liner 220 unremoved. A protection layer 222 is formed over the nFET 214 in the nFET region to facilitate processing of pFET 218 on the unprotected pFET region.

The high-K dielectric liner 202 is formed directly over the pFET 218 only. The high-K dielectric liner 202 contains a high-K material with oxygen transportability that can facilitate the introduction of oxygen into the high-K gate dielectric 204. The hollow arrows show the movement of oxygen from the surrounding atmosphere into the high-K dielectric liner 202 (the high-K dielectric liner 202 functioning as an oxygen getter from the ambient).

After a sufficient period of time to load the high-K dielectric liner 202 with a desired amount of oxygen, a compressive stress liner 224 is formed over the high-K dielectric liner 202 coated pFET 218. The compressive stress liner 224 prevents oxygen from out diffusing from the high-K dielectric liner 202, permitting the high-K dielectric liner 202 to deliver a controlled amount of oxygen to the high-K gate dielectric 204. The white arrows in the high-K dielectric liner 202 under the compressive stress liner 224 show the movement of oxygen within the high-K dielectric liner 202, and specifically the movement of oxygen in the high-K dielectric liner 202 to the high-K gate dielectric 204. The compressive stress liner 224 also prevents oxygen from out diffusing from the high-K dielectric liner 202 in general and the high-K gate dielectric layer 204 in particular during subsequent acts that involve heating the structure, such as annealing, oxidation, silicide formation, and the like.

The amount of oxygen contained in the high-K dielectric liner 202, and thus the amount of oxygen that can migrate into the high-K gate dielectric layer 204 is dependent on a number of factors including: the amount of oxygen in the atmosphere surrounding the CMOS structure, the temperature of the atmosphere surrounding the CMOS structure, the thickness of the high-K dielectric liner, the length of time that the high-K dielectric liner is exposed to an oxygen atmosphere, the identity of the high-K material in the high-K dielectric liner, and the like.

High-K materials or dielectrics that form the high-K gate dielectrics and/or the high-K dielectric liners have a dielectric constant greater than silicon dioxide (silicon dioxide has a dielectric constant of 3.9). In another embodiment, high-K materials have a dielectric constant greater than about 10. The high-K materials employed for the high-K dielectric liners also have suitable oxygen mobility, permitting the movement of oxygen therewithin to facilitate the oxygenation of the high-K gate dielectric.

The relatively high dielectric constant of a gate dielectric improves transistor performance. Specifically, the relatively high gate dielectrics increase the transistor capacitance enabling efficient and reliable switching between an on state and an off state, with relatively low current when off yet relatively high current when on.

High-K gate dielectrics have at least one high-K atom that contributes to the high-K properties of the high-K gate dielectrics. In one embodiment, the High-K gate dielectrics have at least two high-K atoms that contribute to the high-K properties of the high-K gate dielectrics. General examples of high-K atoms include elements of Group IVA of the Periodic Table and elements from the Lanthanide Series of the Periodic Table. Specific examples of high-K atoms include zirconium, hafnium, lanthanum, and gadolinium.

The composition of the high-K dielectric liners (and high-K gate dielectrics) can be represented by one or more of the following chemical formulae:

wherein M, $M^1$ and $M^2$ are independently an element of Group IVA or an element from the Lanthanide Series; $M^2$ is nitrogen, an element of Group IVA, or an element from the Lanthanide Series; and x is less than 1 and greater than 0. Specific examples include $HfO_2$, $ZrO_2$, $Hf_xSi_{1-x}O_2$, $Zr_xSi_{1-x}O_2$, $La_xSi_{1-x}O_2$, $Hf_xLa_{1-x}O_2$, $Gd_xSi_{1-x}O_2$, HfZrSiO, HfLaSiO, and HfGdSiO, where x is between 0 and 1. In some instances, numerical subscripts are not shown since the amount of each atom may vary depending upon a number of factors described later (thus when not shown, the subscript may be any number).

In one embodiment, the composition of the high-K dielectric liner does not contain HfSiON. In some environments HfSiON displays poor oxygen mobility characteristics. However, additional examples of materials that can be employed for the high-K gate dielectric include HfSiON and ZrSiON. The high-K dielectric liner and the high-K gate dielectric may contain the same or different composition.

Generally speaking, the high-K dielectric liner is formed using chemical vapor deposition (CVD) techniques, such as metal organic chemical vapor deposition (MOCVD), plasma enhanced chemical vapor deposition (PECVD), low pressure chemical vapor deposition (LPCVD), and the like.

The high-K dielectric liners are formed in an atmosphere containing a suitable amount of oxygen to provide the high-K dielectric liners with the required dielectric and oxygen mobility characteristics. In one embodiment, the amount of oxygen surrounding the semiconductor structure during formation of the high-K dielectric liner is from about 5% or from about 10 ppm by volume to about 100% by volume. In another embodiment, the amount of oxygen surrounding the semiconductor structure during formation of the high-K dielectric liner is from about 10% by volume to about 90% by volume. In yet embodiment, the amount of oxygen surrounding the semiconductor structure during formation of the high-K dielectric liner is from about 20% by volume to about 75% by volume. Higher amounts of oxygen enable greater amounts of oxygen to diffuse into the high-K dielectric liners and/or enable shorter oxygen exposure times.

The high-K dielectric liners are formed at a suitable temperature to provide the high-K dielectric liners with the required dielectric and oxygen mobility characteristics. In one embodiment, the temperature during formation of the high-K dielectric liner is from about 100° C. to about 400° C. In another embodiment, the temperature during formation of the high-K dielectric liner is from about 150° C. to about 350° C. In yet another embodiment, the temperature during formation of the high-K dielectric liner is from about 200° C. to about 300° C.

The high-K dielectric liners are formed to a suitable thickness to provide the high-K dielectric liners with the required dielectric and oxygen mobility characteristics. In one embodiment, the thickness of the high-K dielectric liners formed is from about 1 nm to about 100 nm. In another embodiment, the thickness of the high-K dielectric liners formed is from about 2 nm to about 70 nm. In yet another embodiment, the thickness of the high-K dielectric liners formed is from about 3 nm to about 50 nm. The high-K dielectric liner may or may not have the same thickness as the high-K gate dielectric. The thickness of the high-K dielectric liner may be the same as or different from the thickness of the high-K gate dielectric.

The high-K dielectric liners remain on the pFET for a suitable period of time to provide the high-K gate dielectric liners with the required oxygen. In some instances, the high-K dielectric liners permanently remain on the pFET. In one embodiment where the high-K dielectric liner is removed from the pFET, the high-K dielectric liner remains on the pFET for a time from about 10 seconds to about 5 minutes. In another embodiment where the high-K dielectric liner is removed from the pFET, the high-K dielectric liner remains on the pFET for a time from about 20 seconds to about 3 minutes. In yet another embodiment where the high-K dielectric liner is removed from the pFET, the high-K dielectric liner remains on the pFET for a time from about 30 seconds to about 2 minutes.

Referring to FIGS. 3 to 11, a general embodiment where the high-K dielectric liner is removed from the pFET is described. Reference numbers remain the same throughout FIGS. 3 to 11 for like features and may not be repeated in each figure for simplicity.

Figure 3:
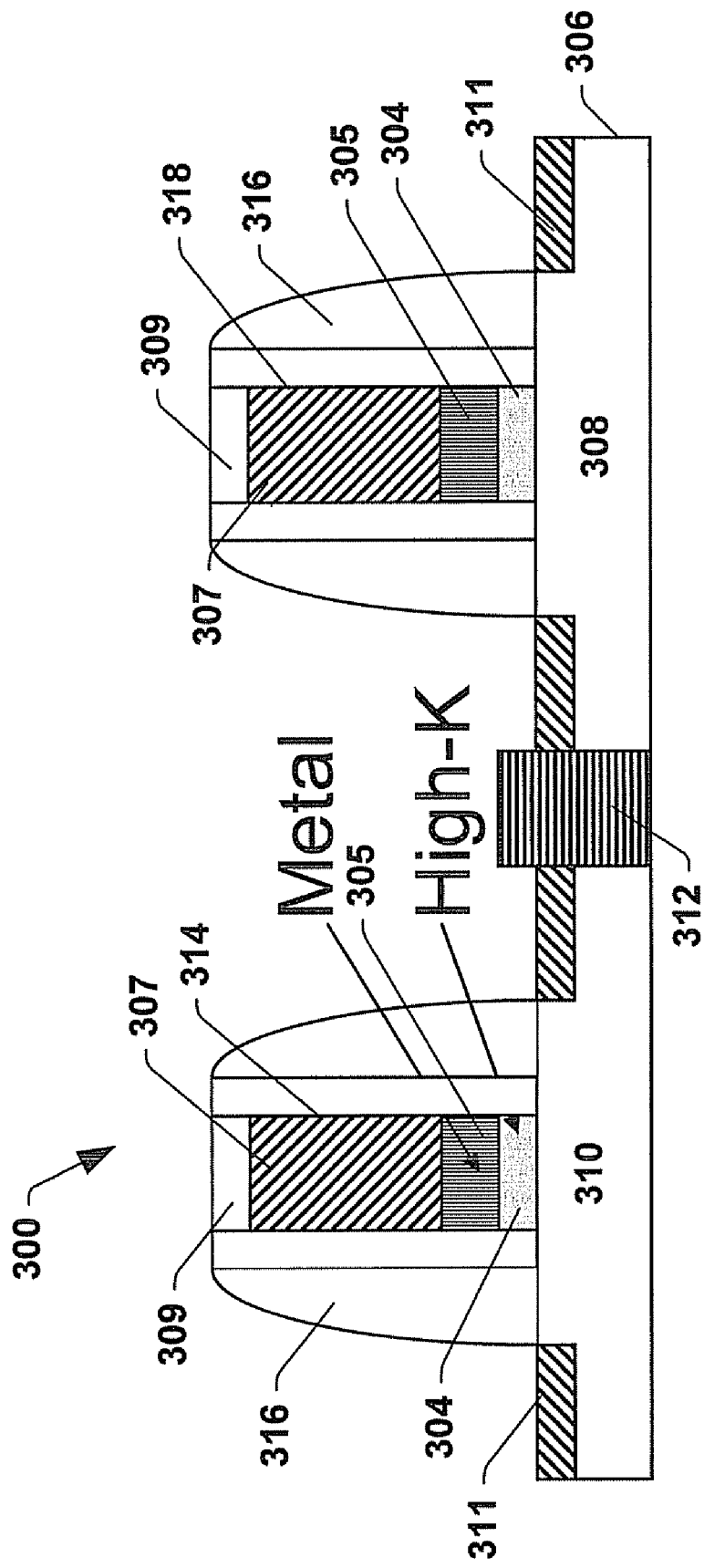
FIGS. 3 to 11 are cross-sectional views of structures involved in making and using high-K dielectric liners in accordance with an aspect of the invention.

Referring to FIG. 3, a CMOS structure 300 is provided. The CMOS structure 100 contains a substrate 306 with a pFET region 308 and an nFET region 310, and optionally isolation structures 312 therein. Any substrate may be employed. Examples of semiconductor substrates include wafers, silicon such as single crystal silicon, germanium, silicon on insulator (SOI), silicon carbide (SiC), doped silicon, III-V materials such as gallium arsenide (GaAs) or indium phosphide (InP), and the like. The substrate may optionally already have any number of structures thereon.

An nFET 314 is formed in the nFET region while a pFET 318 is formed in the pFET region. Both the nFET and pFET contain a silicide 309 over polysilicon 307, the polysilicon 307 over a metal gate 305 which over a high-K gate dielectric 304, all of which are optionally surrounded by spacers 316. Source/drain regions 311 for the nFET 314 and pFET 318 are shown within substrate 306. The thickness of the high-K gate dielectric is sufficient to mitigate gate leakage current. In one embodiment, the thickness of the high-K gate dielectric is from about 0.5 nm to about 10 nm. In another embodiment, the thickness of the high-K gate dielectric is from about 0.75 nm to about 5 nm. In yet another embodiment, the thickness of the high-K gate dielectrics is from about 1 nm to about 3 nm.

The metal gate contains a metal, metal alloy, or metal containing compound. Examples of metal gate materials include one or more of titanium nitride, tantalum nitride, platinum, ruthenium, aluminum, titanium, palladium, cobalt, nickel, tungsten, alloys thereof, and the like.

Figure 4:
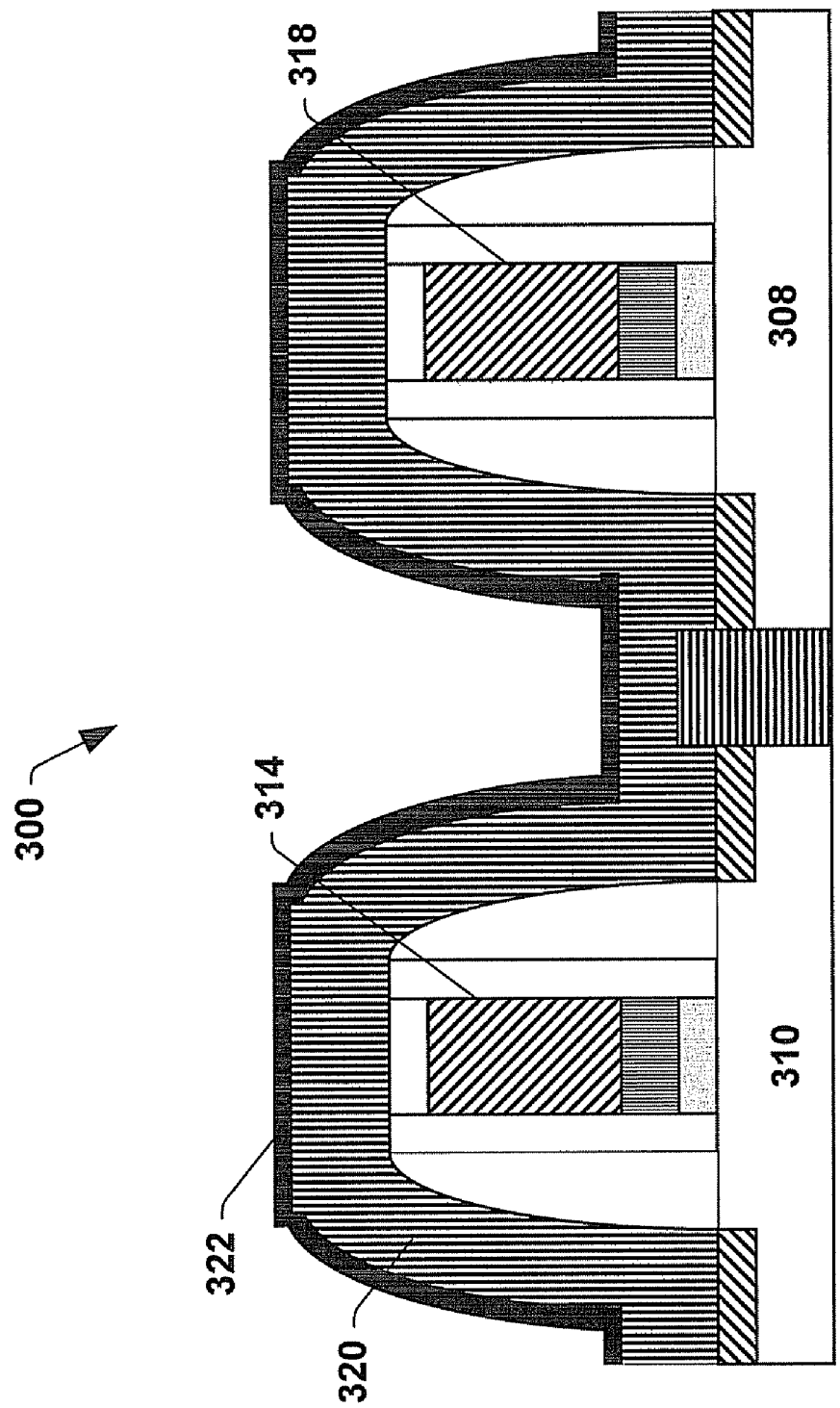

Referring to FIG. 4, a silicon nitride liner 320 with tensile stress is formed over the structure 300 in both the nFET region and pFET region. The tensile stress liner 320 contains a material, such as a dielectric material including silicon nitride or silicon oxynitride, that controls stress within the structure 300. A protection layer 322 is formed over the structure 300 and specifically is formed over the tensile stress liner 320 in both the nFET region and pFET region. The protection layer 322 is contains a material that shields devices in the nFET region during subsequent processing of the pFET region. For example, the protection layer 322 can contain an oxide such as silicon dioxide.

Figure 5:
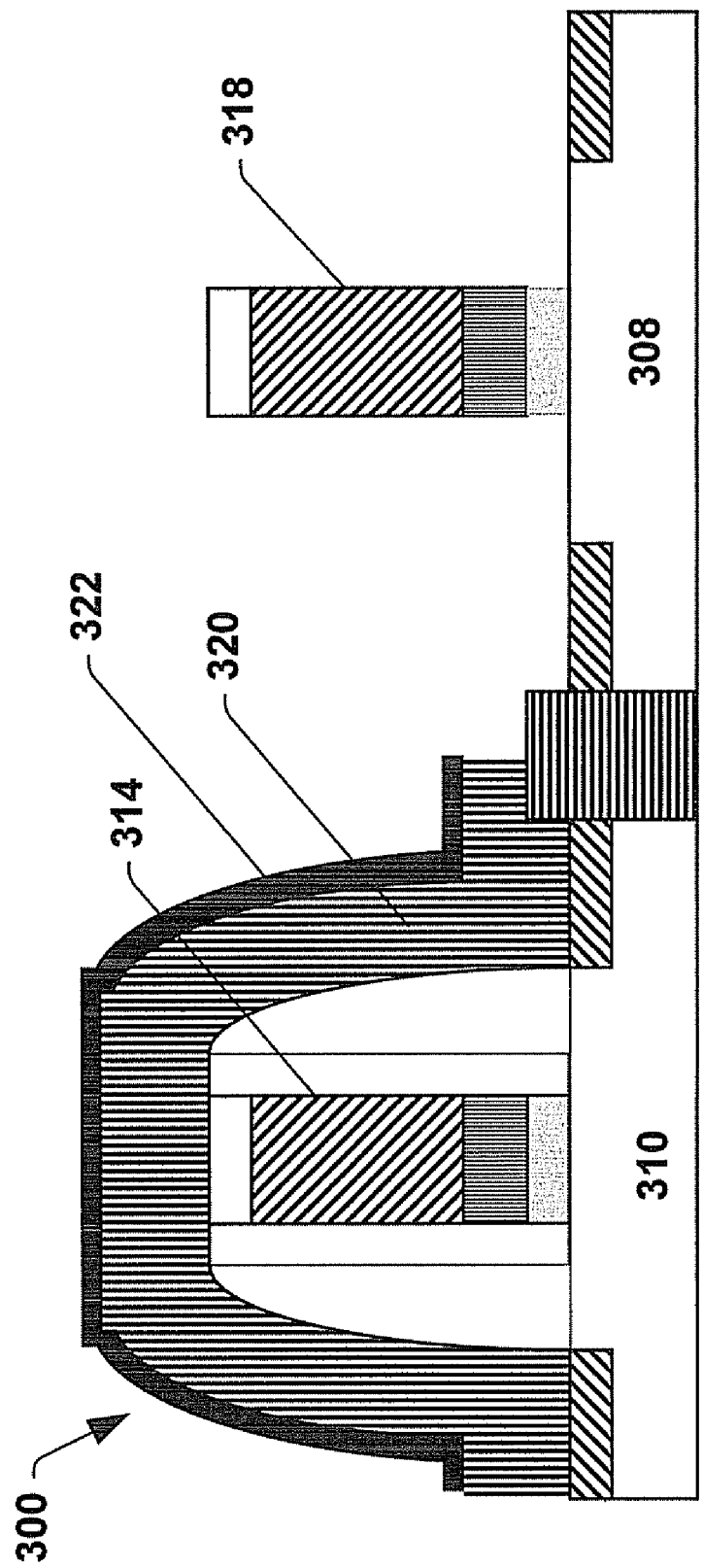

Referring to FIG. 5, the silicon nitride liner 320 and the protection layer 322 are removed from the pFET region. Standard lithographic techniques involving masking the protection layer 322 in the nFET region and etching exposed portions of the protection layer 322 (over the pFET 318) can be employed. If present, the spacers 316 can be removed from pFET 318.

Figure 6:
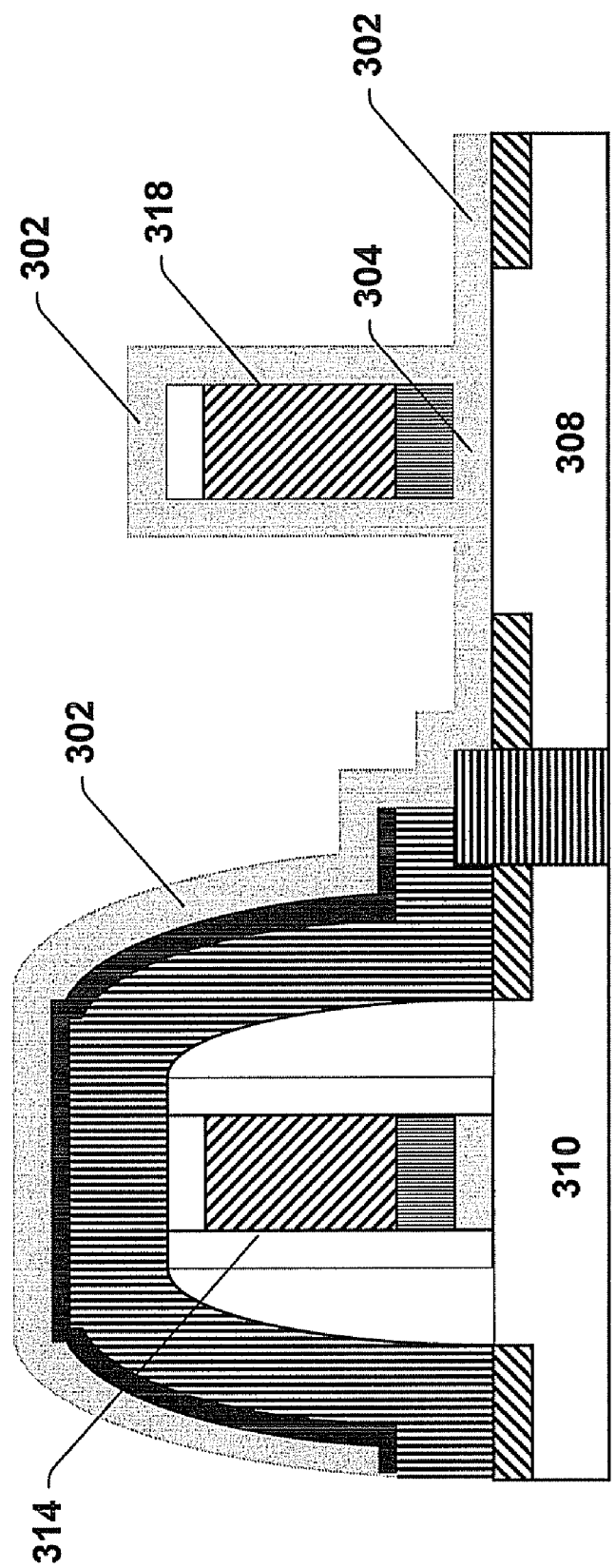

Referring to FIG. 6, a high-K dielectric liner 302 is formed to a suitable thickness directly over the pFET 318 only (covering or partially encapsulating the pFET). While the high-K dielectric liner 302 may be formed over the entire structure 300, the high-K dielectric liner 302 directly contacts the pFET 318, as the high-K dielectric liner 302 is not in direct contact with the nFET 314. The tensile stress liner 320 and the protection layer 322 separate the high-K dielectric liner 302 from the nFET 314. Although not shown, the nFET region may be masked and the high-K dielectric liner 302 formed over the pFET region. The high-K dielectric liner 302 is in direct contact with the high-K gate dielectric layer 304. The high-K dielectric liner 302 and the high-K gate dielectric layer 304 may or may not contain the same material.

Techniques for making the high-K dielectric 304 and/or the high-K dielectric liner 302 include, for example, using CVD or atomic layer deposition (ALD) techniques. Another exemplary method of forming the high-K gate dielectric involves initially forming a layer of a conventional gate dielectric, such as silicon dioxide. Next, a layer of high-K atoms is formed over the conventional gate dielectric. The layer of high-K atoms can be formed by sputtering, physical vapor deposition, or the like. The structure is subjected to a heat treatment which drives the high-K atoms of the layer of high-K atoms into the conventional gate dielectric layer driving the creation of new chemical bonds between and/or amongst the high-K atoms, silicon, oxygen, and/or nitrogen, thereby creating the high-K gate dielectric.

Figure 7:
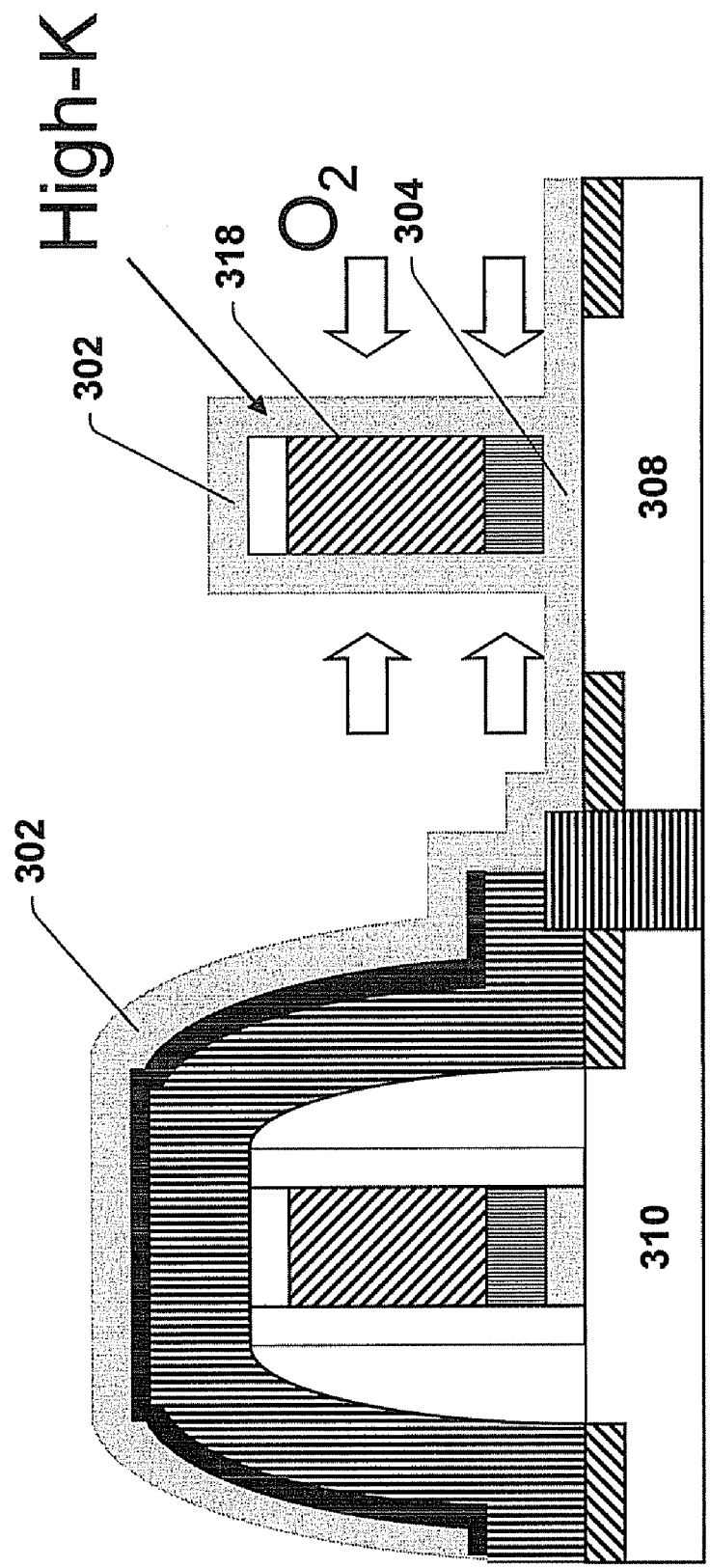

Referring to FIG. 7, the hollow arrows show the movement of oxygen from the surrounding atmosphere into the high-K dielectric liner 302. In this connection, the high-K dielectric liner 302 functions as an oxygen getter from the ambient atmosphere. Conditions are employed (such as temperature, amount of oxygen in the air, etc.) to facilitate the introduction of oxygen into the high-K dielectric liner 302. Since the high-K material of the high-K dielectric liner 302 has oxygen transportability characteristics, the movement of oxygen within the high-K dielectric liner 302 and the introduction of oxygen from the high-K dielectric liner 302 into the high-K gate dielectric 304 are facilitated. The high-K dielectric liner 302 remains on the structure 300 for a sufficient period of time to oxygenate the high-K gate dielectric 304.

Figure 8:
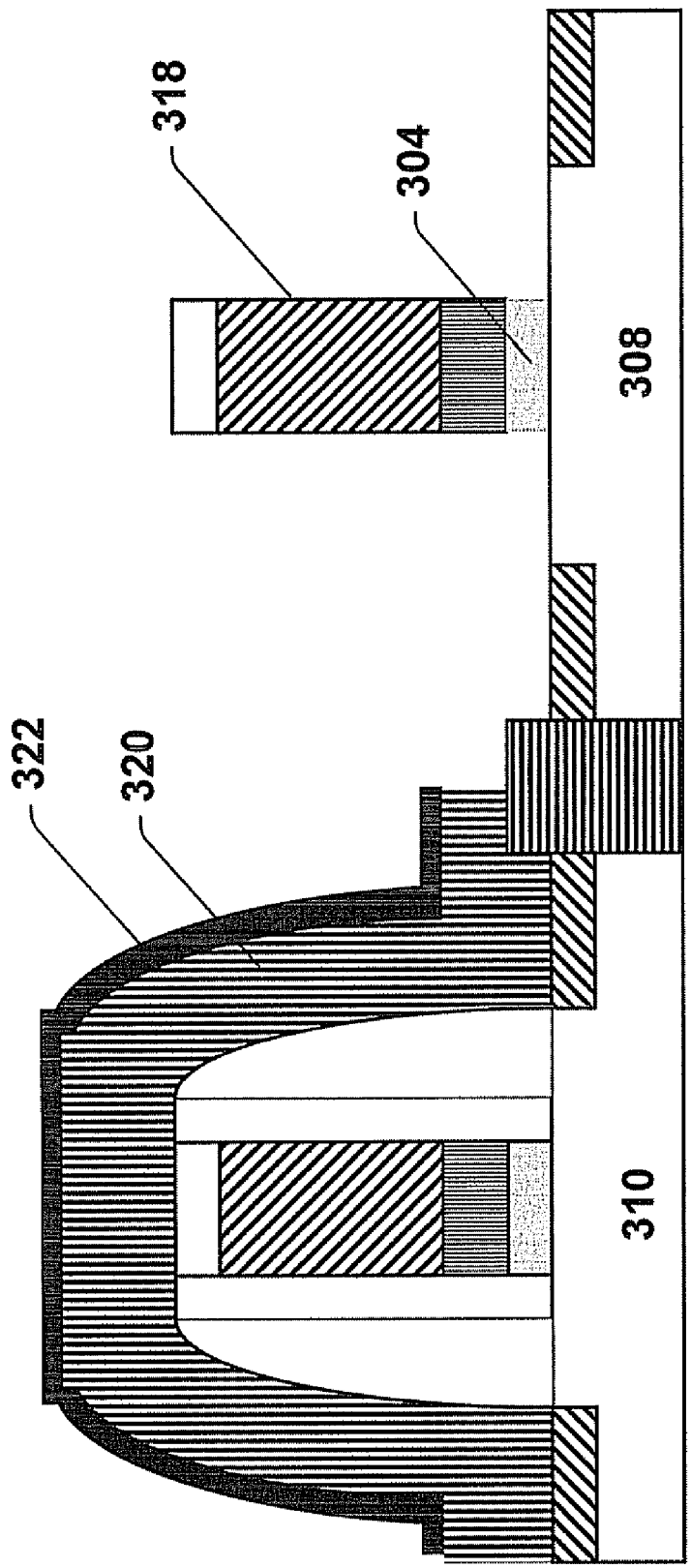

Referring to FIG. 8, after a sufficient period of time, the high-K dielectric liner 302 is removed from the structure 300. Wet or plasma etching techniques may be employed to remove the high-K dielectric liner 302 from the structure 300. In one embodiment, to prevent undercut of the high-K gate dielectric 304, anisotropic etching techniques are employed. The specific technique/etchant depends upon the specific identity of the material that forms the high-K dielectric liner 302.

Figure 9:
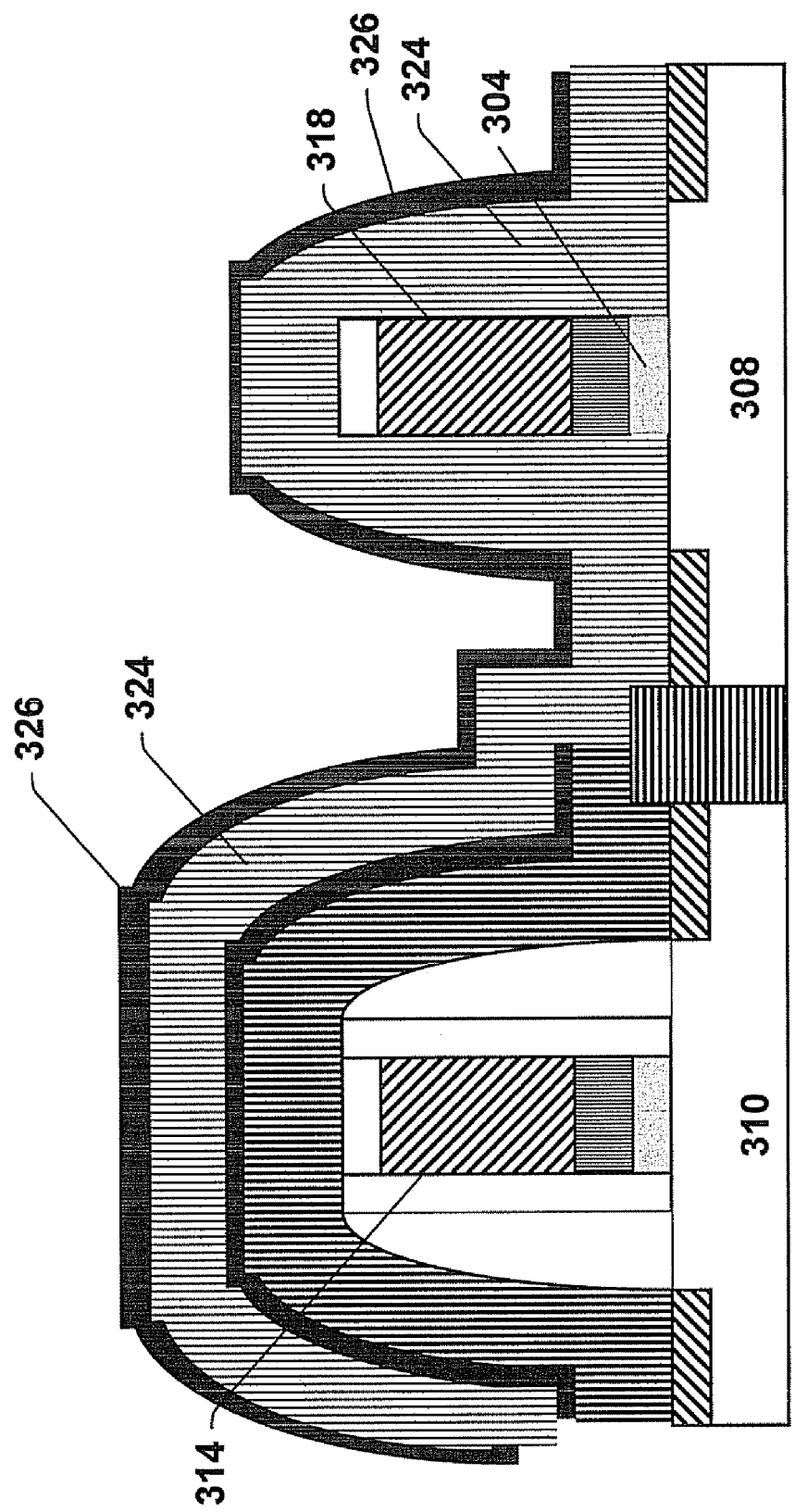

Referring to FIG. 9, a silicon nitride liner 324 with compressive stress is formed over the structure 300 in both the nFET region and pFET region (although not shown, the compressive stress liner 324 can alternatively be formed over the pFET region only). The compressive stress liner 324 contains a material, such as a dielectric material including silicon nitride or silicon oxynitride, that controls stress within the structure 300. A second protection layer 326 is formed over the structure 300 and specifically is formed over the compressive stress liner 324 in both the nFET region and pFET region (or only over the compressive stress liner 324 in the pFET region if the compressive stress liner 324 is only formed in the pFET region). The second protection layer 326 can contain an oxide such as silicon dioxide.

Figure 10:
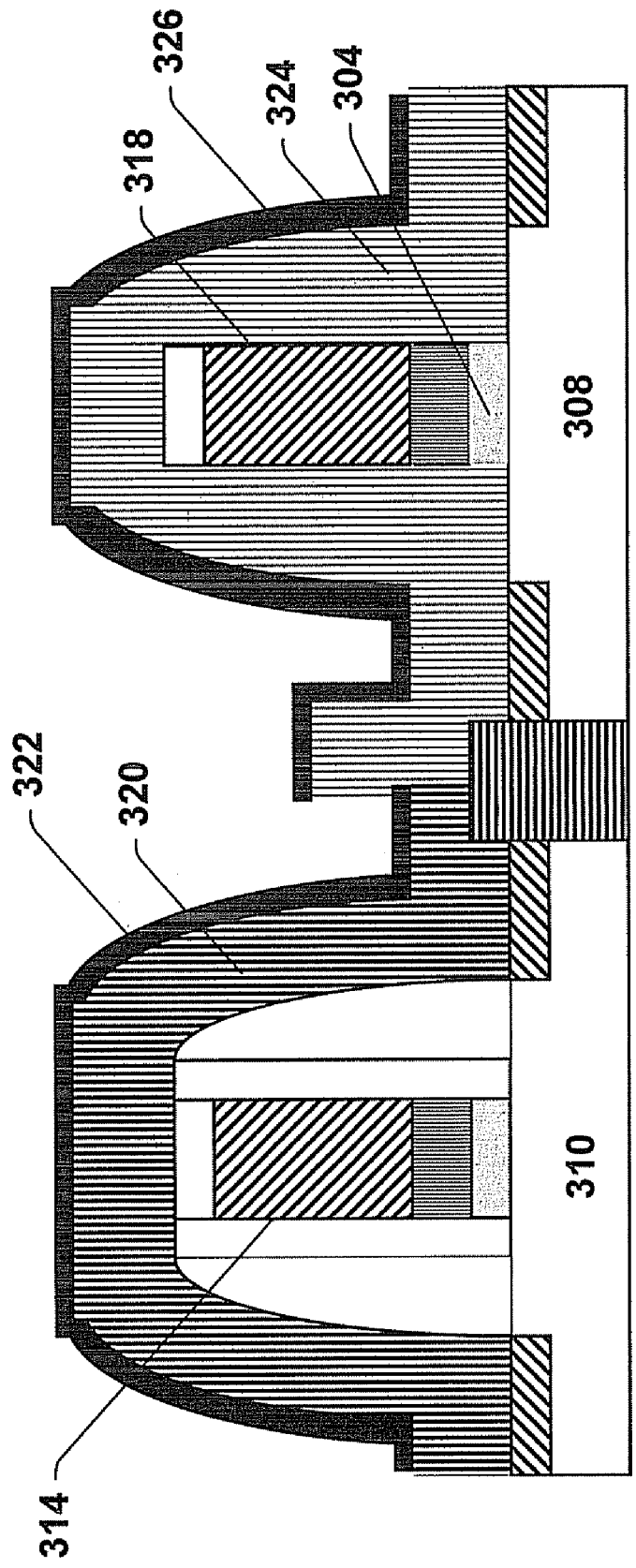

Referring to FIG. 10, in portions of the structure 300 that contain both a tensile and compressive stress liner 320/324 and a first and second protection layer 322/326, such as in the nFET region, the second protection layer 326 and the compressive stress liner 324 are removed. The pFET region of the structure 300 can be masked, and the second protection layer 326 and the compressive stress liner 324 can be removed from the nFET region using wet or plasma etching techniques.

Figure 11:
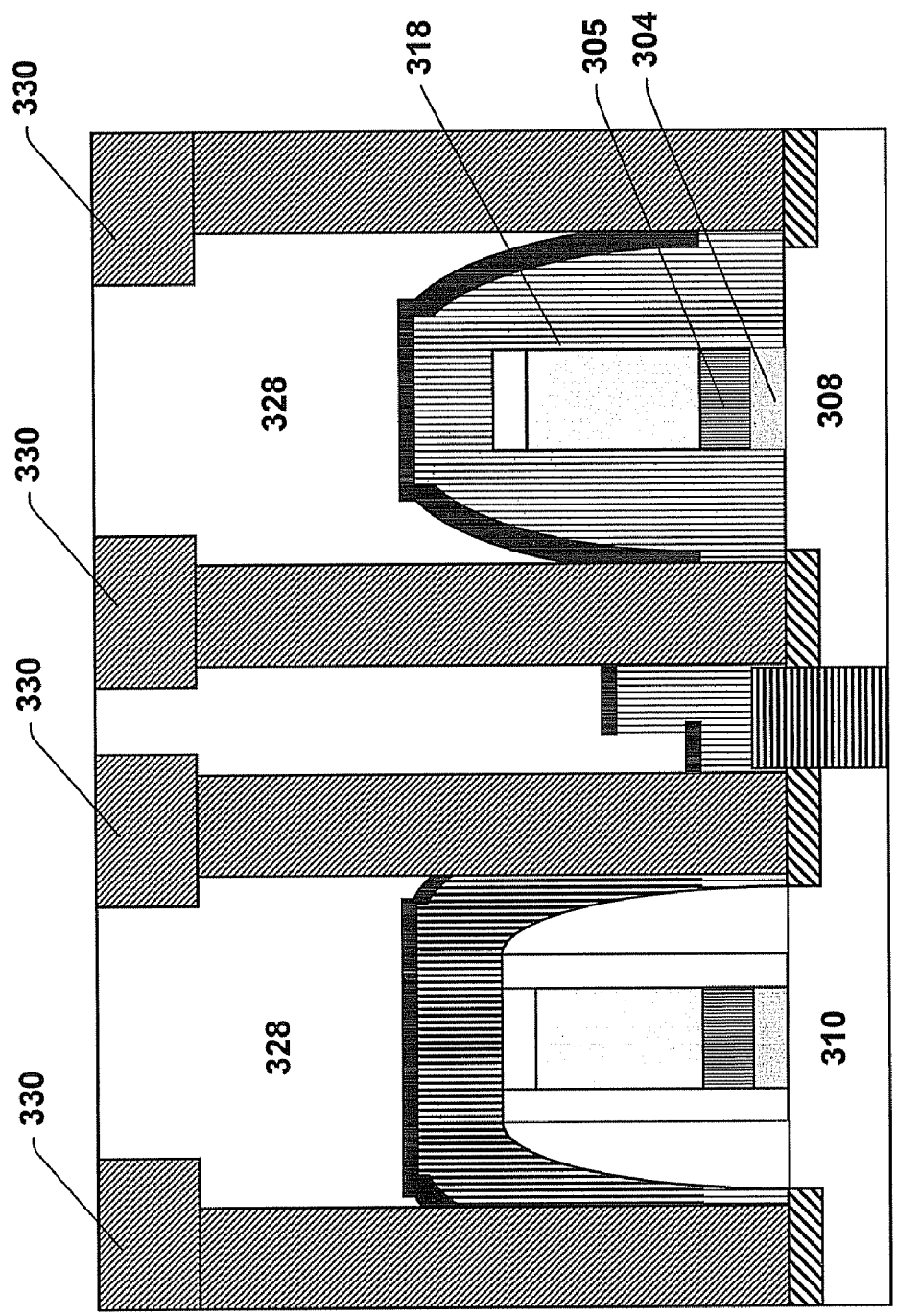

Referring to FIG. 11, an interlayer dielectric 328 is formed over the structure 300. Contact holes (not shown) are formed in the interlayer dielectric 328, and contacts 330 are formed within the interlayer dielectric 328. The contacts contain any suitable conductive material such as metals, alloys, and conductive polymers. In pFET 318, due to use of the high-K dielectric liner 302, a controllably oxygenated high-K gate dielectric 304 results in a gate first processing scheme. Even if the gate length of the high-K gate dielectric 304 is relatively long, oxygen is effectively introduced into the high-k gate dielectric reaching the center portion thereof to result in a desired Vth shift, without causing substantial re-growth of silicon dioxide and interfacial states, especially near the edges of the high-k gate dielectric layer. Moreover, the oxidized high-K gate dielectric 304 does not experience undesirably increased Vth due to subsequent anneal acts in BEOL.

Referring to FIGS. 3 to 7 and 12 to 16, a general embodiment where the high-K dielectric liner remains on the pFET for further processing is described. The description of FIGS.

Figure 12:
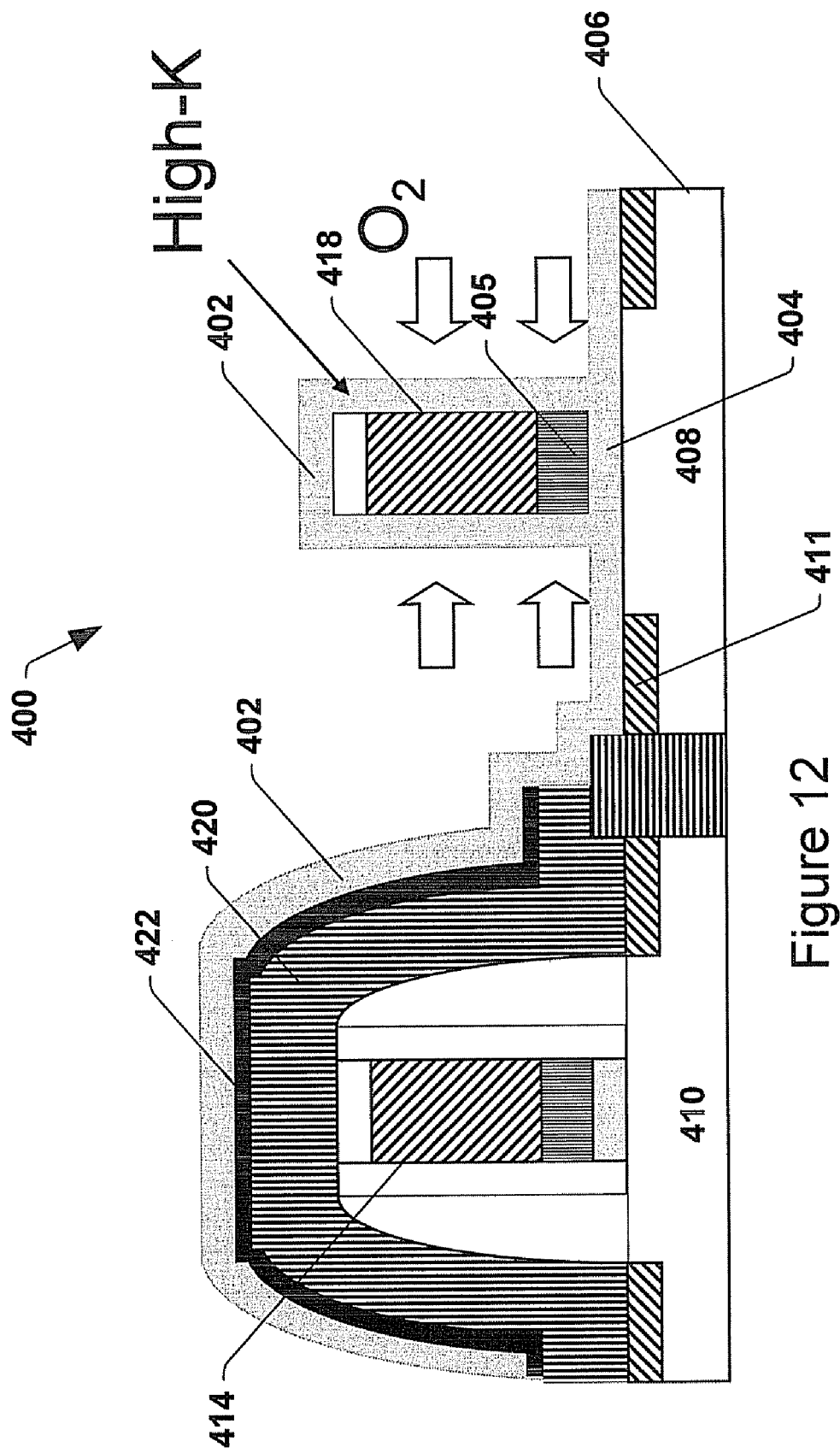
FIGS. 12 to 16 are cross-sectional views of structures involved in making and using high-K dielectric liners in accordance with another aspect of the invention.

3 to 7 is not repeated for brevity. FIG. 12 is analogous to FIG. 7, but different although corresponding reference numerals are employed.

Referring to FIG. 12, a high-K dielectric liner 402 is formed to a suitable thickness directly over and in contact with the pFET 418 only (covering or partially encapsulating the pFET). While the high-K dielectric liner 402 may be formed over the entire structure 400, the high-K dielectric liner 402 directly contacts the pFET 418, as the high-K dielectric liner 402 is not in direct contact with the nFET 414. The tensile stress liner 420 and the protection layer 422 separate the high-K dielectric liner 402 from the nFET 414. Although not shown, the nFET region may be masked and the high-K dielectric liner 402 formed over the pFET region. The high-K dielectric liner 402 is in direct contact with the high-K gate dielectric layer 404. The high-K dielectric liner 402 and the high-K gate dielectric layer 404 may or may not contain the same material. The structure 400 contains an nFET 414 and a pFET 418, each of which contain a high-K gate dielectric 404 and a metal gate 405, and each of which has associated source/drain regions 411. The hollow arrows show the movement of oxygen from the surrounding atmosphere into the high-K dielectric liner 402.

Figure 13:
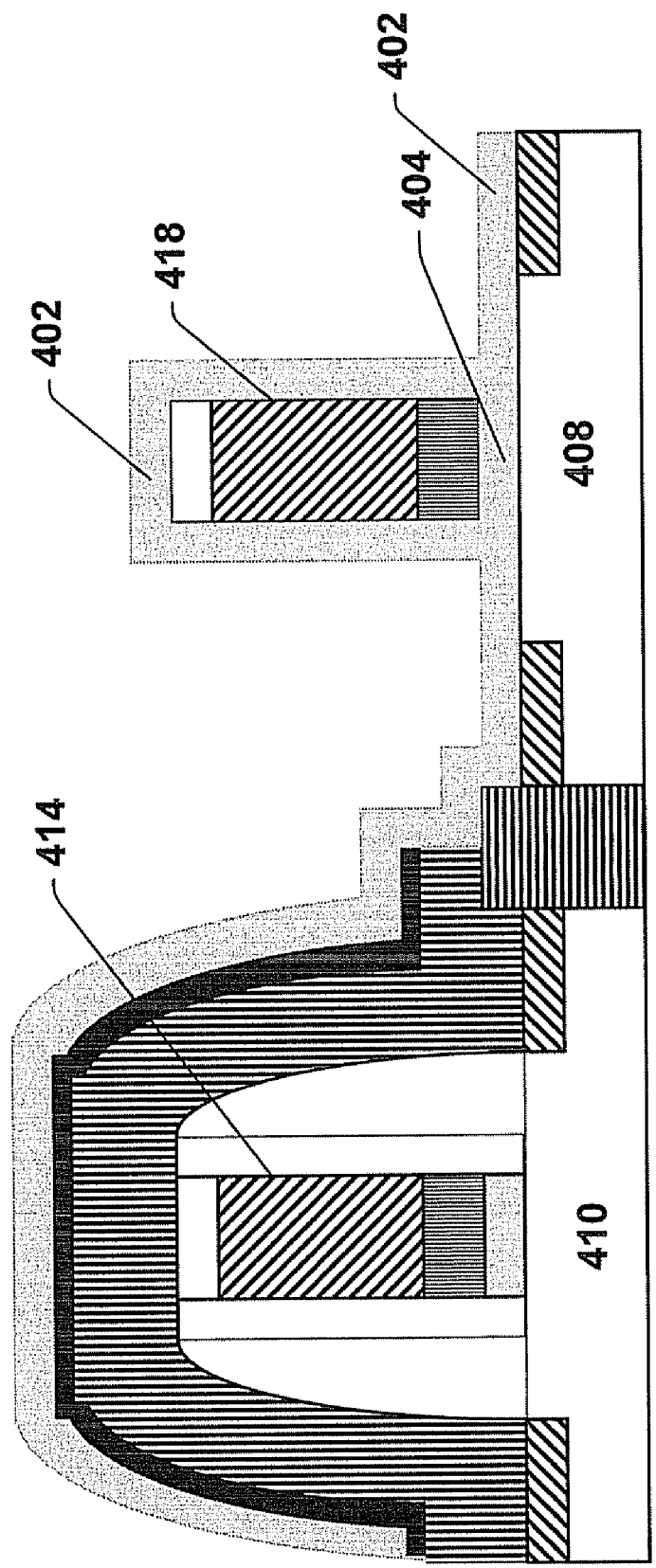

Referring to FIG. 13, conditions are employed (such as temperature, amount of oxygen in the air, etc.) to facilitate the introduction of oxygen into the high-K dielectric liner 402. Since the high-K material of the high-K dielectric liner 402 has oxygen transportability characteristics, the movement of oxygen within the high-K dielectric liner 402 and the introduction of oxygen from the high-K dielectric liner 402 into the high-K gate dielectric 404 are facilitated. The high-K dielectric liner 402 remains on the structure 400 to controllably oxygenate the high-K gate dielectric 404.

Figure 14:
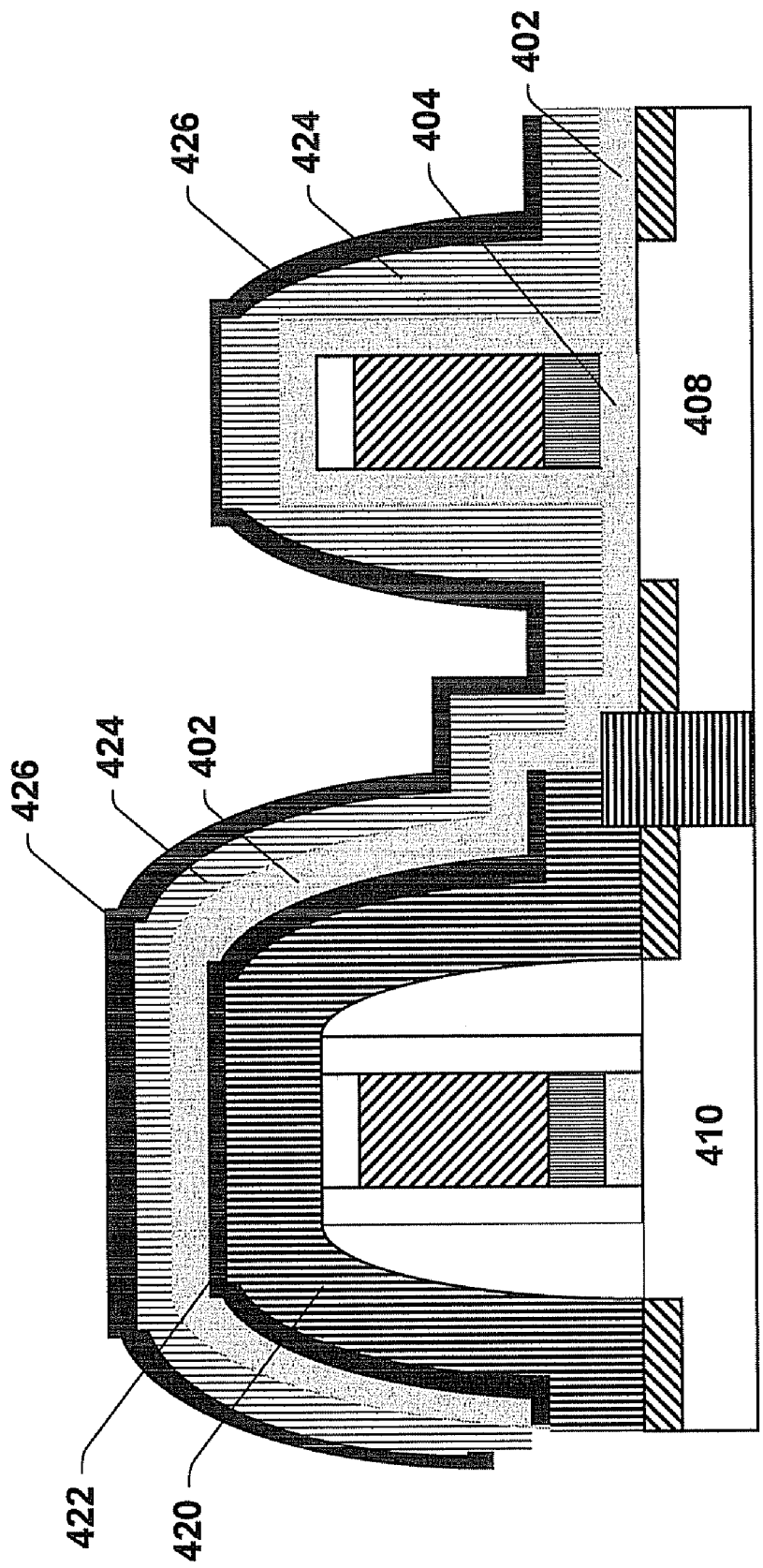

Referring to FIG. 14, a compressive stress liner 424 is formed over the structure 400 in both the nFET region and pFET region (although not shown, the compressive stress liner 424 can alternatively be formed over the pFET region only). The compressive stress liner 424 is formed over the high-K dielectric liner 402, as the high-K dielectric liner 402 is not removed from the structure. The compressive stress liner 424 contains a material, such as a dielectric material including silicon nitride or silicon oxynitride, that controls stress within the structure 400. The material of the compressive stress liner 424 has the ability to prevent or mitigate the out diffusion of oxygen from the high-K dielectric liner 402. A second protection layer 426 is formed over the structure 400 and specifically is formed over the compressive stress liner 424 in both the nFET region and pFET region (or only over the compressive stress liner 424 in the pFET region if the compressive stress liner 424 is only formed in the pFET region). The second protection layer 426 can contain an oxide such as silicon dioxide. It is noted that the pFET 418 does not have spacers.

Figure 15:
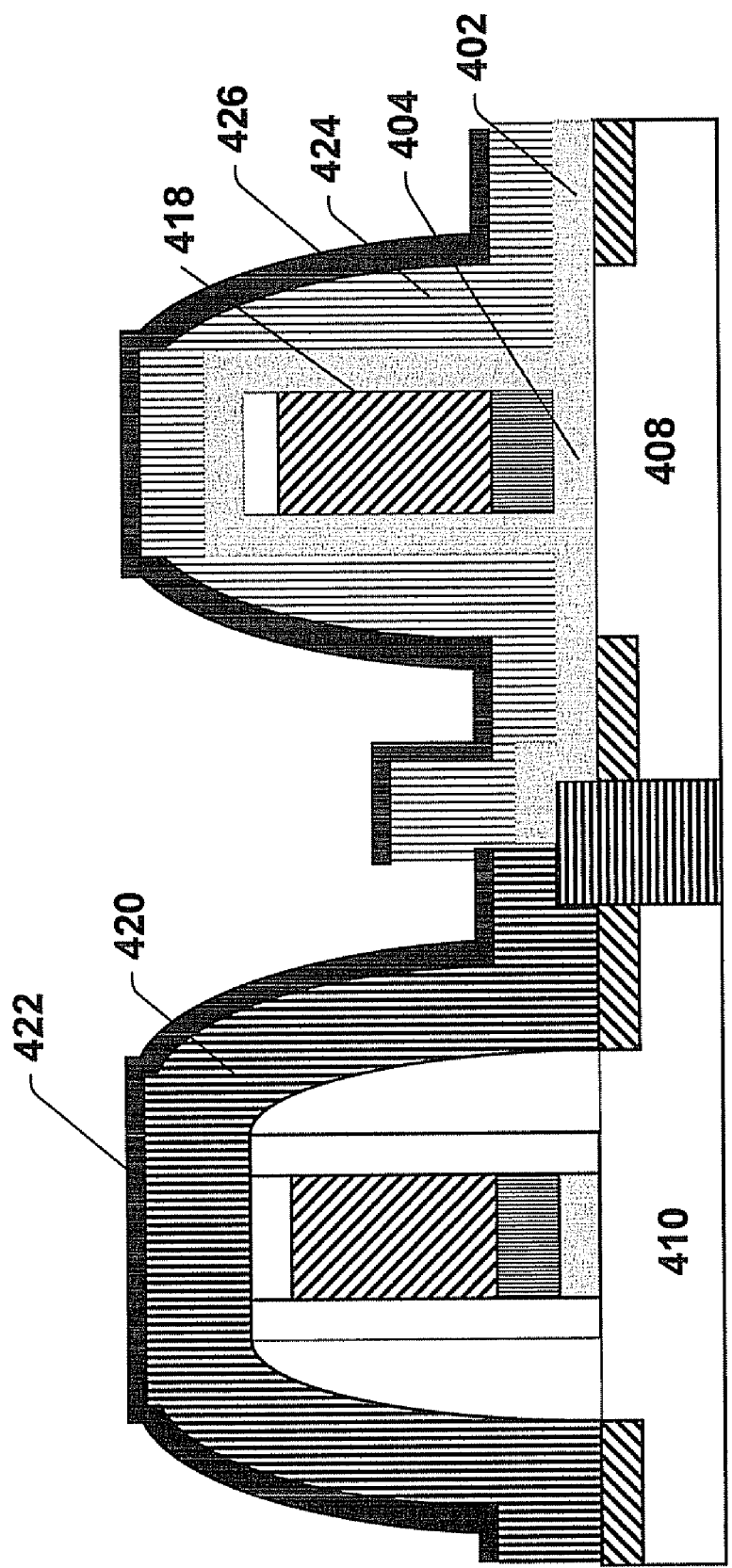

Referring to FIG. 15, in portions of the structure 400 that contain both a tensile and compressive stress liner 420/424 and a first and second protection layer 422/426, such as in the nFET region, the second protection layer 426, the compressive stress liner 424 are removed, and the high-K dielectric liner 402 are removed. The pFET region of the structure 400 can be masked, and the second protection layer 426, the compressive stress liner 424, and the high-K dielectric liner 402 can be removed from the nFET region using wet or plasma etching techniques. The high-K dielectric liner 402 in the pFET region and in contact with the high-K gate dielectric 404 of the pFET 418 remains on the structure 400.

Figure 16:
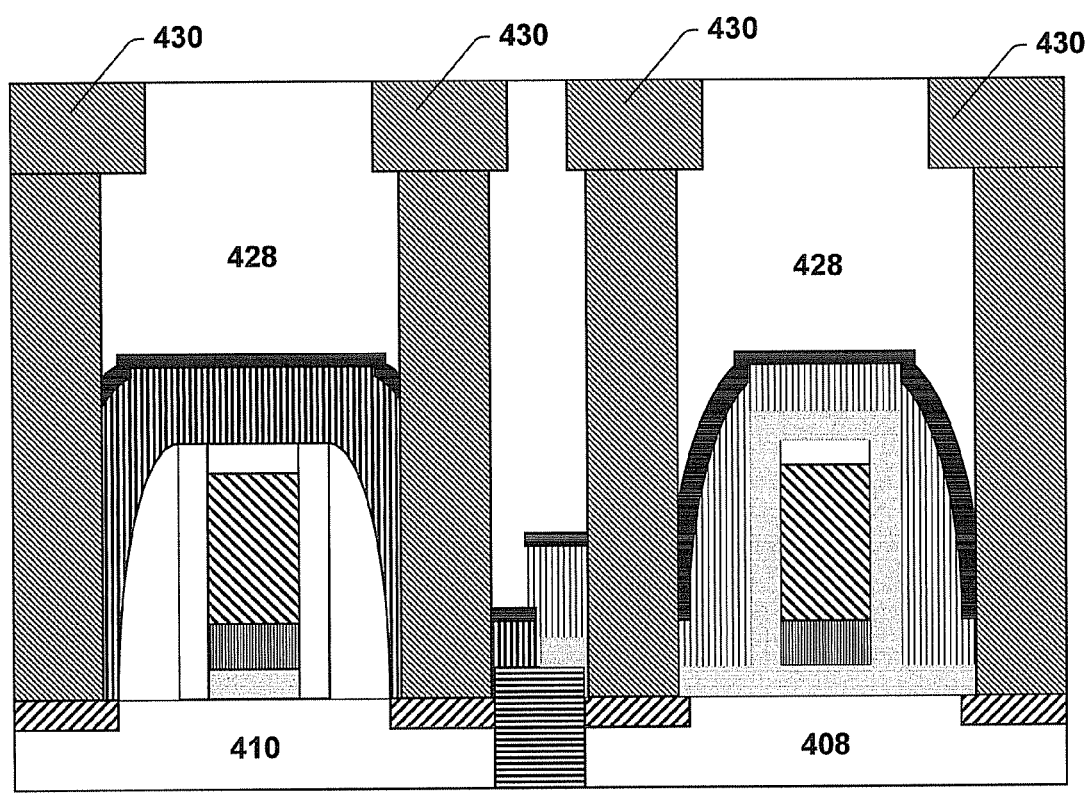

Referring to FIG. 16, an interlayer dielectric 428 is formed over the structure 400. Contact holes (not shown) are formed in the interlayer dielectric 428, and contacts 430 are formed within the interlayer dielectric 428. The contacts contain any suitable conductive material such as metals, alloys, and conductive polymers. In pFET 418, due to the presence of the high-K dielectric liner 402, a controllably oxygenated high-K gate dielectric 404 is maintained in a gate first processing scheme. Even if the gate length of the high-K gate dielectric 404 is relatively long, oxygen is controllably introduced into the high-k gate dielectric reaching the center portion thereof to result in a desired Vth shift, without causing substantial re-growth of silicon dioxide and interfacial states, especially near the edges of the high-k gate dielectric layer. Moreover, owing to the presence of the high-K dielectric liner 402, the high-K gate dielectric 404 does not experience undesirably increased Vth due to subsequent anneal acts in BEOL.

The methods of making and using high-K dielectrics liners can be applied to any type of microelectronic devices including CMOS transistors, NMOS transistors (negative channel metal oxide semiconductor), PMOS transistors (positive channel metal oxide semiconductor) transistors, core logic transistors including LOP transistors and LSTP transistors, I/O transistors, non-volatile memory cell transistors, transistors on any of RAM, flash, DRAM, SRAM, SDRAM, FRAM, MRAM, ROM, PROM, EPROM, EEPROM, CPU, LSI, VLSI, ASIC, FPGA, DSP, and the like. That is, the methods of making and using high-K dielectric liners can be applied to any type of integrated circuit (IC) chip/chip set containing microelectronic devices.

With respect to any figure or numerical range for a given characteristic, a figure or a parameter from one range may be combined with another figure or a parameter from a different range for the same characteristic to generate a numerical range.

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method of oxidizing a high-K gate dielectric in an integrated circuit structure, comprising:
    forming a high-K dielectric liner over a FET, the FET comprising a metal gate and the high-K gate dielectric, the high-K dielectric liner in contact with the high-K gate dielectric to allow oxygen from the high-K dielectric liner to oxidize the high-K gate dielectric,
    wherein the high-K dielectric liner is annealed at a temperature from about 100° C. to about 400° C. and the high-K dielectric liner comprises one of $HfO_2$, $ZrO_2$, $Hf_xSi_{1-x}O_2$, $Hf_xLa_{1-x}O_2$, $Zr_xSi_{1-x}O_2$, $La_xSi_{1-x}O_2$, $Gd_xSi_{1-x}O_2$, HfZrSiO, HfLaSiO, or HfGdSiO, where x is between 0 and 1.

2. The method of claim 1 comprised in a gate first CMOS process.

3. The method of claim 1, wherein the high-K dielectric liner has a thickness from about 1 nm to about 100 nm.

4. The method of claim 1, wherein the high-K dielectric liner is annealed at a temperature from about 150° C. to about 350° C.

5. The method of claim 1, wherein the high-K dielectric liner is formed in an atmosphere comprising from about 10 ppm by volume to about 100% by volume oxygen.

6. The method of claim 1 further comprising removing the high-K dielectric liner from over the FET.

7. The method of claim 6, before removing the high-K dielectric liner, keeping the high-K dielectric liner in contact with the high-K gate dielectric for a time from about 10 seconds to about 5 minutes.

8. The method of claim 1 further comprising forming a silicon nitride liner over the high-K dielectric liner to mitigate out diffusion of oxygen from the high-K dielectric liner.

9. The method of claim 1, with the proviso that the high-K dielectric liner does not comprise HfSiON.

10. A method of reducing Vth of a pFET comprising a high-K gate dielectric, comprising:

forming a high-K dielectric liner over the pFET, the pFET comprising a metal gate and the high-K gate dielectric, the high-K dielectric liner in contact with the high-K gate dielectric to allow oxygen from the high-K dielectric liner to oxidize the high-K gate dielectric, wherein the high-K dielectric liner is annealed at a temperature from about 100° C. to about 400° C. and the high-K dielectric liner comprises one of $HfO_2$, $ZrO_2$, $Hf_xSi_{1-x}O_2$, $Hf_xLa_{1-x}O_2$, $Zr_xSi_{1-x}O_2$, $La_xSi_{1-x}O_2$, $Gd_xSi_{1-x}O_2$, HfZrSiO, HfLaSiO, or HfGdSiO, where x is between 0 and 1.

11. The method of claim 10, wherein the high-K dielectric liner is formed in an atmosphere comprising from about 10% by volume to about 90% by volume oxygen, and keeping the high-K dielectric liner in contact with the high-K gate dielectric for a time from about 10 seconds to about 5 minutes.

12. The method of claim 10, wherein the high-K dielectric liner has a thickness from about 1 nm to about 100 nm.

13. The method of claim 10, wherein the high-K dielectric liner comprises $HfO_2$.

14. A method of oxidizing a high-K gate dielectric in an integrated circuit structure, comprising:

forming a high-K dielectric liner over a FET, the FET comprising a metal gate and the high-K gate dielectric, the high-K dielectric liner in contact with the high-K gate dielectric to allow oxygen from the high-K dielectric liner to oxidize the high-K gate dielectric, wherein the high-K dielectric liner is formed in an atmosphere comprising from about 10 ppm by volume to about 100% by volume oxygen.

15. The method of claim 14, wherein the high-K dielectric liner is annealed at a temperature from about 100° C. to about 400° C.

16. The method of claim 14, wherein the high-K dielectric liner is formed in an atmosphere comprising from about 10% by volume to about 90% by volume oxygen.

17. The method of claim 14 further comprising removing the high-K dielectric liner from over the FET.

18. The method of claim 17, before removing the high-K dielectric liner, keeping the high-K dielectric liner in contact with the high-K gate dielectric for a time from about 10 seconds to about 5 minutes.

* * * * *